(12) United States Patent
Thompson et al.

(10) Patent No.: US 6,365,554 B1
(45) Date of Patent: Apr. 2, 2002

(54) SEPARATING LAYER FOR HEAT TREATING SUPERCONDUCTING WIRE

(75) Inventors: Elliott D. Thompson, Coventry, RI (US); Jesse Marquardt, Boylston; Derek P. Daly, Sharon, both of MA (US)

(73) Assignee: American Superconductor Corporation, Westborough, MA (US)

( * ) Notice: Subject to any disclaimer, the term of this patent is extended or adjusted under 35 U.S.C. 154(b) by 0 days.

(21) Appl. No.: 09/548,258

(22) Filed: Apr. 12, 2000

Related U.S. Application Data

(63) Continuation-in-part of application No. 09/309,220, filed on May 10, 1999, which is a continuation of application No. 08/235,560, filed on Apr. 29, 1994, now Pat. No. 5,952,270.
(51) Int. Cl.[7] .............................................. H01L 39/24
(52) U.S. Cl. .................... 505/434; 505/430; 174/125.1; 427/62
(58) Field of Search ................................ 505/430, 434; 174/125.1; 29/424, 599; 427/62, 226

(56) References Cited

U.S. PATENT DOCUMENTS

| | | | | |
|---|---|---|---|---|
| 5,086,037 A | * | 2/1992 | Hitotsuyanagi et al. ........ 505/1 |
| 5,122,326 A | * | 6/1992 | Jackson et al. ............. 264/102 |
| 5,140,006 A | * | 8/1992 | Woolf ............................ 505/1 |
| 5,252,547 A | * | 10/1993 | Itozaki et al. .................. 505/1 |

* cited by examiner

*Primary Examiner*—Mark Kopec
(74) *Attorney, Agent, or Firm*—Elizabeth E. Nugent; Choate, Hall & Stewart

(57) ABSTRACT

An oxide superconductor wire is prepared by preparing a length of precursor wire for processing into an oxide superconductor wire and coating the precursor wire with an isolating layer. The coated wire is wound onto a reel in a spiraling manner, such that each turn of the spiral is in substantial alignment with the preceding turn of the spiral along an axis perpendicular to the axis of winding. The wound precursor wire is then heated to form the oxide superconductor. The removable isolating layer is prepared by coating the wire with a solution including a metal compound and a porosity-inducing component, and heating the coated wire so as to induce porosity and control grain size of the metal compound so as to render the coating removable. The coating functions to isolate the overlapping turns of the wound wire from neighboring wires, so that no diffusion bonding or adherence between the turns occurs. The coating preferably comprises a material that can be reduced or decomposed to form a solderable metal.

21 Claims, 4 Drawing Sheets

SEPARATING LAYER FOR HEAT TREATING SUPERCONDUCTING WIRE

This application is a continuation-in-part of U.S. Ser. No. 09/309,220, filed May 10, 1999 (pending), which is a continuation of U.S. Ser. No. 08/235,560, filed Apr. 29, 1994 (now U.S. Pat. No. 5,952,270), both of which are incorporated herein by reference.

FIELD OF THE INVENTION

The invention relates generally to a system and process for manufacturing high transition temperature ($T_c$) oxide superconductor wire. The invention more particularly relates to a system and apparatus for coating, winding and heat treating high $T_c$ oxide superconductor wire.

BACKGROUND OF THE INVENTION

Many applications of the high $T_c$ oxide superconductors require forming the superconductor into a wire. Current processes include forming a precursor to the oxide superconductor or the oxide superconductor itself into a wire and heat treating the wire to obtain an oxide superconducting wire. Current developments in high $T_c$ oxide superconductor processing have resulted in the manufacture of increasingly longer lengths of oxide superconductor wire with acceptable current carrying capacity. The loading and unloading of oxide superconductor wire is an important step in the processing of the wire, in particular, to move the wire between wire deforming steps, such as pressing and rolling, and oxide superconductor phase-forming steps, such as sintering and annealing. The prior art wire deforming step is typically carried out by feeding the wire from a conventional spool through the deforming step and taking up the deformed wire onto a second conventional spool. Long lengths of wire can be efficiently wound onto the spool. However, the conventional spool is not readily adaptable for use in furnaces and results in inefficient use of furnace space. Further, the wire tends to sag and become distorted (wavy) because of the coiled form of the wire on the spool. Lastly, the multiple overlapping windings on the spool do not permit efficient oxidation and phase transformation of the oxide superconductor.

A further disadvantage to winding the oxide superconductor wire prior to heat treatment is that overlapping contact between portions of the wire results in diffusion bonding of the wire to itself and the mandrel, thereby degrading superconducting properties and preventing the unspooling of the heat treated wire. Silver is commonly used as a protective cladding for the oxide superconductor, in particular because the cladding itself is electrically conductive and does not prevent oxygen diffusion to the oxide superconductor. However, even the silver cladding will diffusion bond to other portions of the silver-clad wire which are in contact during heat treatment.

U.S. Pat. No. 5,140,006 discloses a method and apparatus for coating a silver-clad oxide superconductor wire with a diffusion bond-inhibiting material and taking up the coated wire onto a spool. Rare earth oxides are specifically disclosed as a desirable diffusion bond-inhibiting material and no disclosure of the desirability of removing the material after treatment is disclosed.

It is an object of the present invention to efficiently process high-$T_c$ superconducting oxide wire by increasing the simplicity and efficiency of the method used to load and unload wire during processing, by reducing adhesion of the wire to itself and by maximizing the use of furnace space during heat treatment. It is a further object of the invention to accomplish the above while maintaining adequate solderability of the wire for subsequent processing.

SUMMARY OF THE INVENTION

In one aspect, the present invention provides a method of processing an oxide superconductor wire that promotes solderability. The method comprises applying an isolating layer to the surface of the wire, the isolating layer comprising an isolating material and a porosity-inducing component, and heating the wire to produce a removable porous coating. The wire can then be processed (e.g., by heat treating), and at least a majority of the porous coating is removed. Finally the wire is exposed to an environment (e.g., a reducing environment such as hydrogen gas, forming gas, hydrogen chloride gas, hydrochloric acid, carboxylic acid, ammonium chloride, a borax, or a solder flux) which converts any remaining portions of the coating into a solderable metal. The isolating material may be, for example, copper oxide or silver sulfide. The porosity-inducing component may be cellulose, wood fiber, saw dust, graphite, paraffin, polypropylene, polyethylene, or mixtures of these, and may be in the form of an extrudable binder. The layer may be applied by a wide variety of methods, including dip coating, spray coating, coating with an adhesive slurry, electroplating, electrostatic attraction, or coextrusion. The majority of the layer may be removed after processing by passing the wire under a stream of water, chemically or electrolytically etching the wire, abrading the wire surface, passing the wire through an ultrasonic bath, wiping the wire, or applying a vacuum or a blower to the wire. At least a majority of the layer is removed, and preferably at least 75%, 80%, 85%, 90%, or 95% is removed.

In another aspect, the invention comprises a method of improving the solderability of a superconducting wire comprising metal compound particles on its surface, by reducing the particles to a solderable metal. The particles may be, for example, copper oxide or silver sulfide, and may be reduced by exposure to hydrogen gas, forming gas, hydrogen chloride gas, hydrochloric acid, carboxylic acid, ammonium chloride, a borax, or solder flux.

In still another aspect, the invention comprises a composite wire reel adapted to be heat treated in a furnace, comprising a composite wire with a removable porous coating comprising copper oxide or silver sulfide on its surface. The wire is wound in a spiraling fashion to form a flat reel, with each turn of the spiral in alignment with the preceding turn of the spiral to form a pancake-like shape. Such reels are well-adapted to be stacked and heat treated in large batches in a furnace.

In yet another aspect, the invention comprises a method of processing an oxide superconductor wire, by co-winding the wire with a separating layer onto a reel, processing the reel, and then removing the separating layer. The separating layer may be, for example, a high temperature superalloy, copper, nickel, or cigarette paper.

In a further aspect, the invention comprises a method of processing an oxide superonductor wire, comprising applying an isolating layer comprising an isolating material and a porosity-inducing component to the wire. The isolating layer is then transformed into a removable porous coating, and the wire is processed. Finally, the wire is exposed to an environment which substantially converts the porous isolating layer into a solderable metal.

BRIEF DESCRIPTION OF THE DRAWINGS

The invention is described with reference to the several figures of the drawing, in which.

DETAILED DESCRIPTION

Figure 1A:
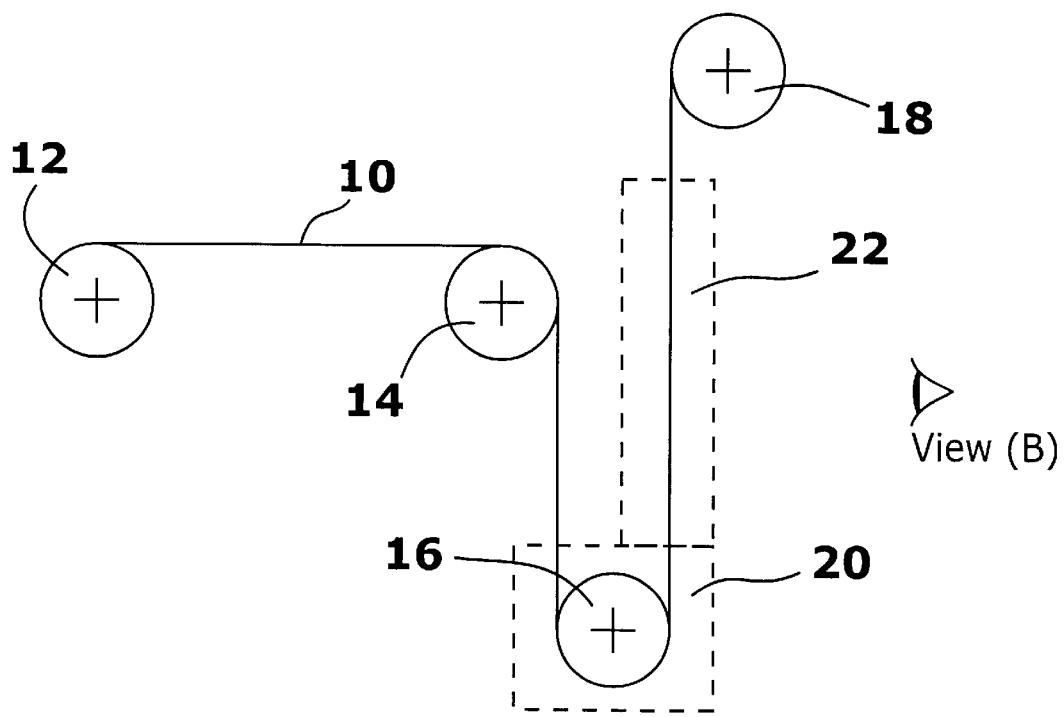
FIG. 1 shows (a) a side view and (b) an edge-on view of an apparatus used in coating and winding the precursor wire onto a reel according to the invention.

The applicants have discovered that coating a superconductor wire with the isolating layer of the present invention results in superior isolation of successive wire layers and in easy removal of the layer for further wire processing. The ease of coating, superiority of its isolating properties and ease of removal provides several processing advantages. Further, the applicants have discovered that the oxide superconductor wire, when wound onto a reel-like support according to the method of the invention, can be processed more efficiently in a furnace environment, without detrimental effect to processing conditions or final superconducting properties. The present invention permits an oxide superconductor wire to be rapidly and efficiently loaded and unloaded onto a cassette reel or a mandrel for furnace processing during oxide superconductor phase-forming steps. The wire then may be transferred to conventional spools for wire-forming steps, if desired. In addition, cassette reels are easily interfaceable with other processing equipment, in particular automated processing equipment, which improves the efficiency of the manufacturing process, if desired. It will be understood by those skilled in the art that as used herein, the terms "superconductor wire" and "superconducting composite" apply equally to wires comprising precursors to oxide superconductors.

The applicants have found that use of a porous isolating layer effectively prevents bonding of the wire turns to each other, while being capable of easy removal. The porosity of the layer increases the ease with which the coating can be removed from the wire by reducing surface area contact with the wire and increasing coating brittleness. The isolating material may be any material which prevents sticking of overlapping layers of superconductor wire and which does not poison the superconducting wire and degrade superconducting properties, but particularly suitable layers are those which can be reduced to a readily solderable base metal.

A variety of metal compounds may be used in the practice of the invention, but copper oxide is preferred. Selection of a particular metal oxide is based on the ease of its removal, its effectiveness in isolation of the wire turns, and its capability of being reduced to a solderable base metal. It is preferred to use metal oxides having a relatively large particle size and, in particular, a particle size in the range of 1 to 50 microns. Particles of small grain size promote adherence to the wire and make the isolating difficult to remove. This adherence is of a mechanical, rather than a chemical, nature.

The porosity of the layer improves the ease of its removal subsequent to the heat treatment. The ability to remove the isolating layer after heat treatment is important because the layer may impede further processing of the wire. For example, where the isolating layer is not completely removed, rolling operations may result in nonuniform stress being applied along the wire length and/or width. Porosity may be obtained by including a porosity-inducing component in the isolating layer which is capable of thermal decomposition or combustion with little or no residue. In the subsequent heat treatment, the porosity-inducing component decomposes or combusts, leaving voids in the isolating layer and thereby introducing porosity into the layer. Suitable porosity-inducing components, include but are in no way limited to, cellulose, wood fiber, saw dust, graphite, paraffin, polypropylene and polyethylene.

The isolating layer (also referred to herein as a "separating" layer), including an isolating material and a porosity-inducing component, may be applied using an inert solvent as the carrier liquid. By inert solvent, it is meant herein that the isolating material and the porosity-inducing component are stable in the solvent with no adverse reactions between the solvent and the added materials. It is further required that the porosity-inducing material be insoluble in the carrier liquid, since a soluble material does not occupy a significant volume in the resulting layer.

The isolating material and the porosity-inducing component are added to an inert solvent. The resultant mixture can be a dispersion, slurry or a suspension; however, due to the low solubility of the isolating material and the porosity-inducing component, the mixture is most typically a suspension or slurry. The solvent is preferably volatile, so that evaporation of the solvent and subsequent adherence of the layer to the wire occurs rapidly. The solvent is preferably a low molecular weight liquid, such as ethanol, acetone, hexane or water. In other embodiments, the isolating material may be dispersed in a fluid adhesive, which aids coating of the wire as described below.

The weight percent of added solids (isolating material+ porosity-inducing component) in the mixture may be in the range of 5 to 25 wt %. An exemplary mixture is prepared by adding approximately 100 g powder into 1 liter of ethanol (approx. 10 wt %). The solids range from 5 wt % to 99 wt % isolating material, the balance porosity-inducing component. The greater the level of isolating material in the solids, the more effective the anti-bonding effect of the layer; however, this improvement may be obtained at the cost of the removability of the layer. It will be apparent to those skilled in the art that the ideal balance between anti-bonding and removability will vary by application. The reducing techniques of the present invention enable superconducting composites to be manufactured using compositions with a lesser degree of removability, and in some applications, it may even be possible to use the finished wire without removing the coating at all.

It may be desirable to vary the relative proportions of the isolating material and porosity-inducing component in the isolating layer during processing of the oxide superconductor wire, where the layer is repeatedly applied and removed. For example, in early processing steps, where greater problems with sticking or bonding of the wire turns is observed, it is desirable to apply an isolating layer of higher isolating material content, e.g., greater than 50%. In later processing steps, where bonding of the wire turns is less marked, it is desirable to apply an isolating layer with higher levels of porosity-inducing component to facilitate easy removal of the layer. The appearance of the wire is also greatly improved.

The mixture may be applied to the wire in any conventional manner, including but not limited to, spray coating and dip coating and the like. Spray coating includes generating droplets of the carrier liquid containing the isolating material and porosity-inducing component therein and impinging the droplets on the surface. Dip coating includes passing the wire through a bath which contains a mixture of the isolating material and porosity-inducing component therein. In other embodiments of the invention, the isolating material and the porosity-inducing component may be introduced in two separate application steps (e.g., spray coating of first one, and then the other, component onto the layer). In such embodiments, the porosity-inducing component is preferably applied closest to the wire in order to ensure easy release. The isolating material may also be applied in its metallic form (e.g., by electroplating), and then converted to an appropriate oxide by exposure to an oxidizing environment (which may be either liquid or gaseous).

It is also within the scope of the invention to apply the mixture via coextrusion, electrostatic adhesion, or electroplating. In coextrusion embodiments, the isolating material is mixed with a malleable binder (e.g., polyethylene or a mixture of polyethylene and paraffin), and the mixture is coextruded with the superconducting wire through a pressure die. After coating, the wire can be wound on a reel as described below, and the malleable binder is removed by sublimation. For example, if a polyethylene/paraffin binder is used, the reel can be subjected to a temperature in the range of about 150° C.–250° C. and a pressure less than about $10^{-4}$ torr. Alternatively, a sweep gas could be used to remove the binder by entrainer sublimation. These techniques for removing a binder to create the porous separating layer are described in more detail in U.S. Pat. No. 5,122,326 to Jackson et al., incorporated herein by reference.

The isolating material may also be applied to the wire electrostatically. In such embodiments, particles of the isolating material are aerated in a fluidized chamber and are electrostatically charged by ionized air. As the particles become charged they repel each other, forming a cloud of charged particles. An electrically grounded superconducting wire can then be passed through the cloud, causing the charged particles to adhere to the wire. The thickness of the coating can be adjusted by varying the voltage applied to the particles. A separate porosity-inducing component is not necessary in such an embodiment, since the particles adhere to the wire by electrostatic force, but such a component may still be used to increase the porosity of the layer.

Figure 1B:
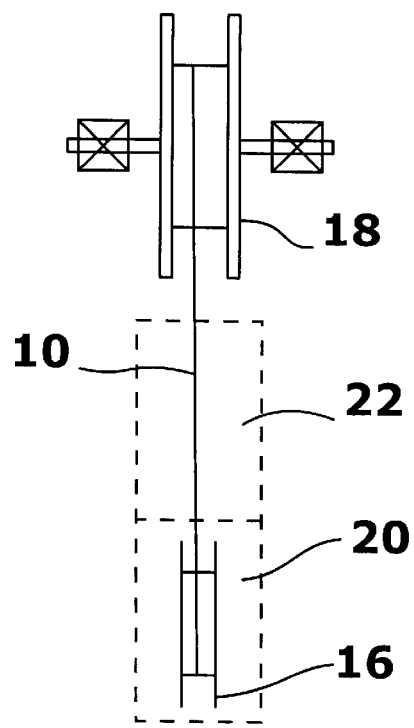

Methods of dip coating are described with reference to an apparatus which is suitable for practicing the invention. Coating and loading a wire onto a reel may be accomplished from a second reel, which is useful when the method is to be integrated with automated reel-based technology. As shown in FIGS. 1(a) and 1(b), superconducting wire 10 passes continuously from a feed reel 12, through a tension roller 14 and a pulley 16, and onto an uptake reel 18. In the apparatus shown, pulley 16 is immersed in a slurry bath 20, which contains the isolating component and the porosity-inducing component. Wire 10 is preferably drawn directly upwards from the pulley 16 through a drying tunnel 22 to the uptake reel 18. Keeping the wire vertical in this step helps keep the slurry coating of a uniform thickness.

Figure 2A:
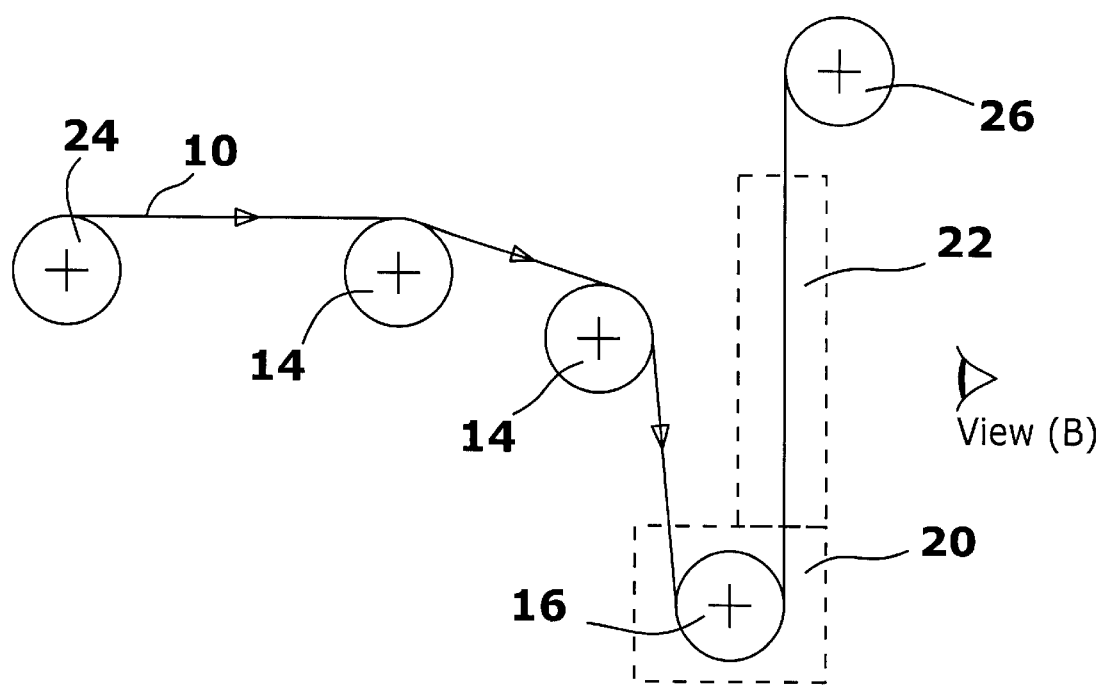
FIG. 2 shows (a) a side view and (b) an edge-on view of an apparatus used in coating and winding the precursor wire onto a mandrel according to the invention.
Figure 2B:
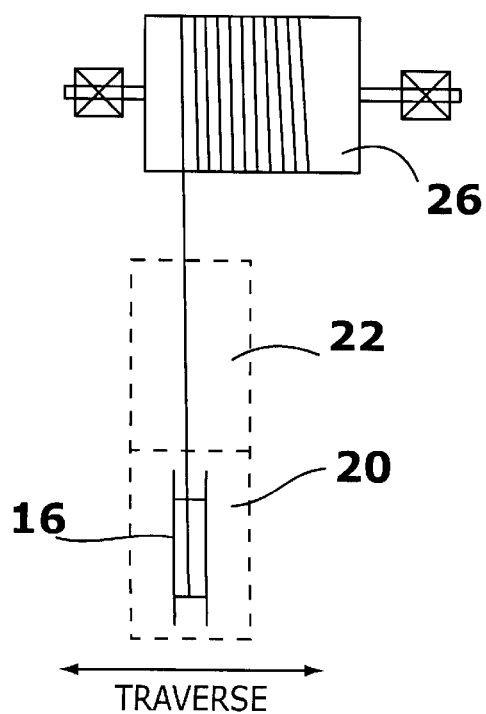

The wire may also be processed from a conventional spool 24 to a mandrel 26, as shown in FIGS. 2(a) and 2(b). This apparatus is similar to that shown in FIGS. 1(a) and 1(b), except that the wire is originally wound on a spool instead of a flat reel, and it is wound onto a mandrel for heat treatment or other further processing. The apparatus shown also comprises two tension rolls 14; it is known in the art to use multiple tension rolls in continuous processing of wires. Finally, when used with a mandrel 26, the apparatus is preferably capable of lateral movement of either the pulley 16 or the mandrel 26, so that the wire can be smoothly wound onto the mandrel, as shown in FIG. 2(b).

It will be readily understood by those skilled in the art that wire may also be wound from a reel onto a mandrel, or from a spool onto a reel. Further, when the coating is not removed, it can function as a desirable insulating layer. It is also within the scope of the invention to spray coat the insulating layer onto the wire during the wire loading and unloading process.

Figure 3:
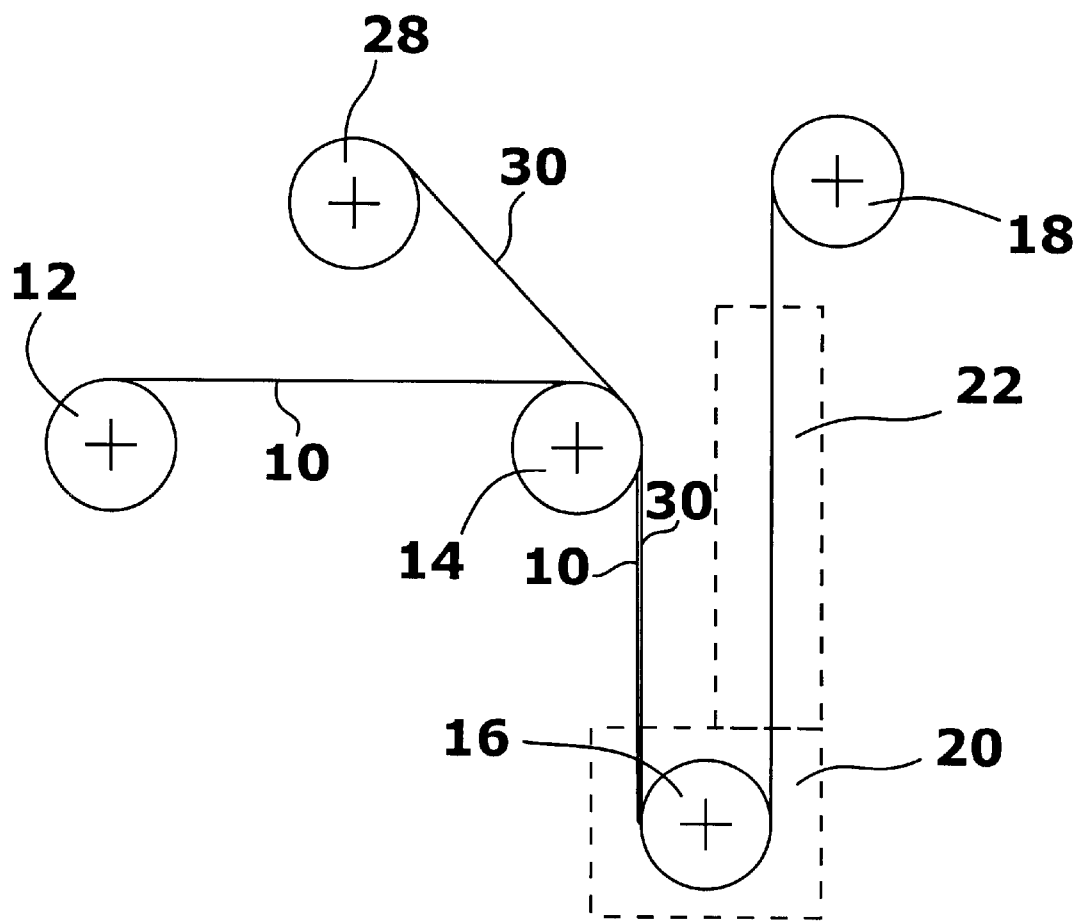
FIG. 3 shows a side view of an apparatus for co-winding a wire and a separating strip.

In still other embodiments of the invention, the separating layer may be applied to the wire in the form of a co-wound strip. In such embodiments, the isolating layer 30 is provided as an independent coil 28, and co-wound with the wire 10 by the winding apparatus as shown in FIG. 3, to isolate adjacent coils of the wire. FIG. 3 still passes the wire through bath 20, which may comprise any liquid which may promote adherence of the isolating layer 30 to the wire 10. In some embodiments, the bath 20 is optional. Depending on the co-wound material, the separating layer may be oxidized in place before the phase transformation heat treat cycle that forms the superconductor. The isolating material in this embodiment may be any material which lends itself to winding and unwinding operations, which prevents self-sticking of the wire, and which does not poison the superconductor. For example, successive layers may be separated with thin strips of high temperature superalloys (e.g., a 0.002" thickness of Haynes alloy 214), copper or nickel strips (which may be partially or fully oxidized), or even with cigarette paper.

It is further contemplated that the wire may take on any geometry, including but not limited to, wires having a circular, ovoid, ellipsoidal, rectangular, square, or polygonal cross-section. The wire may have a width to thickness ratio in the range of 1 to 1000.

Figure 4A:
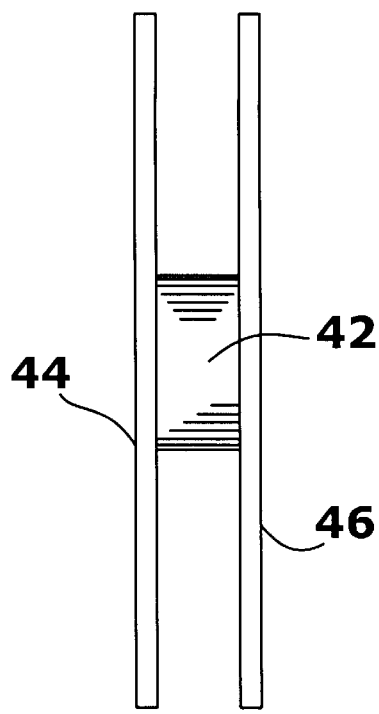
FIG. 4 shows (a) an edge-on view and (b) a side view of a reel used in winding the wire according to the invention.
Figure 4B:
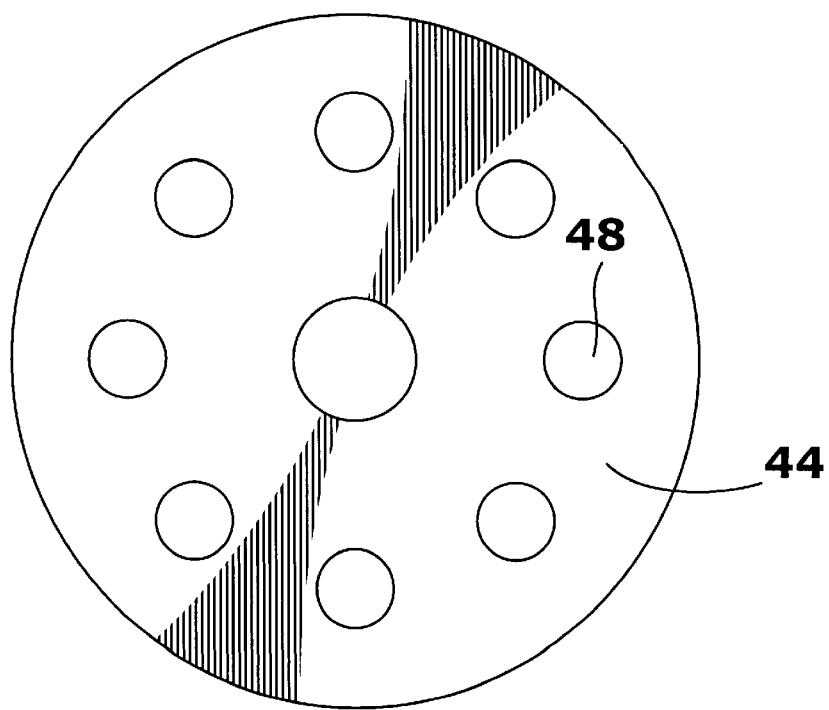

The reel described above may be made from a material capable of withstanding high furnace temperatures (e.g., nickel alloys, stainless steels, or ceramics). With reference to FIG. 4, the reel includes a central mandrel 42 and two opposing end plates 44 and 46, respectively. The mandrel 42 may be of substantially the same width as the wire. The end plates preferably contain apertures 48 to allow the passage of oxygen and/or other processing gases. Alternatively, the reel is made from components capable of assembly and disassembly. In this case, the end plates 44 and 46 are removed from the mandrel 48. The mandrel is a compressible three-piece mandrel which permits it to be removed from the spiral core. The pancake-like wire spiral can be placed on a flat ceramic sheet and heat treated without the reel. It may be preferred to use a retaining ring around the outer circumference of the spiral wire in order to retain its shape during heat treatment. When the reel is removed prior to heat treatment, it is not required to be made out of special high temperature materials. The reel can be made of any material without regard to high temperature stability (e.g., aluminum).

Subsequent to winding the wire onto the reel, the wire is ready for heat treatment. Such heat treatment includes forming the oxide superconductor phase or optimizing the superconducting properties of the wire. The heat treatment may be carried out on the reel, or one or more plates of the reel may be removed prior to heat treatment. During heat treatment, the isolating layer prevents bonding of the neighboring layers. The isolating layer of the invention permits complete overlap of the wire turns without sticking, which is not possible in the prior art.

The isolating layer may be largely removed by passing it under a stream of water, or against an abrasive surface. Ultrasonification will also remove the vast majority of the layer, as will chemically or electrolytically etching the wire.

Other conventional means of removing coatings, such as wipers, vacuum, or blowers, are within the scope of the present invention.

Frequently a very small proportion of particles will remain on the surface of the oxide superconductor wire even after determined efforts to remove them. It has been discovered that these particles may be deleterious in subsequent processing, especially if the wire is to be laminated with another material by soldering. This effect is discussed in commonly assigned patent application, "Encapsulation of Superconducting Composites," U.S. Ser. No. 09/548,215, filed on even day herewith, which is incorporated herein by reference. That application discloses methods of removing the particles from the surface. We have discovered that by proper choice of the material used in the isolating layer, post-processing of the wire can prevent the particles from degrading the solderability of the wire. In particular, particles should be used which can be reduced to a readily solderable metal.

In one preferred embodiment of the invention, copper oxide particles are used in the removable porous coating. After heat treatment and removal of most of the porous coating, some copper oxide particles may remain on the surface of the superconducting wire. These particles can be reduced (at least on their surfaces) to metallic copper by exposing the wire to a reducing environment before soldering. Suitable reducing environments include, for example, hydrogen gas, forming gas, hydrogen chloride gas, or hydrochloric acid and other reducing solutions. For example, exposure to forming gas having a $H_2:H_2O$ ratio in the range of about $10^7$–$10^9$ at a temperature in the range of about 100° C.–500° C. (preferably around 400° C.) is acceptable to reduce copper oxide. Alternatively, a suitable solder flux may be sufficient to reduce the copper oxide particles and allow the solder to adhere fully to the wire. Such fluxes typically contain some combination of carboxylic acid, ammonium chloride, zinc chloride, boraxes, or other reducing agents. When liquid solutions are used either for removing the porous coating or to reduce any remaining particles, it is preferred that the wire be subjected to the vacuum baking treatments described in "Encapsulation of Superconducting Composites," filed on even day herewith.

Removal of the porous coating and exposure to the reducing environment preferably do not significantly degrade the superconducting properties of the wire. For example, it is preferred that the engineering critical current density ($J_c$) not be reduced by more than 10%, and preferably not by more than 2%, by either of these treatments.

The reducing treatments described may have independent utility for improving solderability of superconducting wires. As described in "Encapsulation of Superconducting Composites," filed on even day herewith, during typical heat treatments, "tramp" copper may segregate out of a silver matrix to form copper oxide particles on the surface of the wire. By reducing this copper according to the methods described above, the solderability of the wire can be improved. In addition, tarnish (silver sulfide) on the surface of the silver matrix may be removed by appropriate reducing treatments.

The particles used to form the separating layer of the invention are not limited to oxide particles. Other compounds such as sulfides, chlorides, or the like can be used, as long as they can be reduced or decomposed to leave a solderable metal on the surface of the wire. Solderable metals are those which do not cause substantial dewetting of a wire immersed in molten solder, and include copper, nickel, silver, titanium, beryllium/copper alloys, monels, copper-nickel alloys, gold, and platinum.

The method of the present invention can be used to process any oxide superconductor wire or precursor wire. By way of example, and in no way limiting, the oxide superconductor may include rare earth barium cuprates, bismuth strontium calcium cuprates and thallium barium calcium cuprates. Specific superconducting phases which may be used include BSCCO-2212, BSCCO-2223, (Bi,Pb)SSCO-(2.1)223, YBCO-123, YBCO-124, and YBCO-247. Any of these materials may be thalliated or otherwise doped according to methods known in the art. The oxide superconductor (or precursor) wires are typically processed with silver or other malleable, inert metal to impart desirable mechanical properties to the composite, which may otherwise be too brittle to function as a wire.

The wire used in the invention may be a precursor to an oxide superconductor, such as the metallic alloys disclosed in U.S. Pat. No. 4,826,808 to Yurek et al., herein incorporated by reference, which is then oxidized to form the desired oxide superconductor. Alternatively, the wire may include an oxide superconductor or other ceramic which is subjected to further heat treatment to optimize the formation and properties of the oxide superconductor. The wire preferably contains a malleable, but inert, metal for improved formability and mechanical flexibility. The preferred metal is silver. Oxide superconductor wires suitable for use in the method of the present invention are described in "Critical Issues OPIT Processing of High-$T_c$ BSCCO Superconductors" by Sandhage et al. (*JOM* 43(3), 21–25 (1991)), herein incorporated by reference.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. A method of processing an oxide superconductor wire, comprising the steps of:

providing an oxide superconductor wire, applying an isolating layer to an external surface of the oxide superconductor wire to form a coated wire, the isolating layer comprising an isolating material and a porosity-inducing component;

heating the coated wire so as to induce porosity into the isolating layer, thereby obtaining a removable porous isolating layer;

further processing the coated wire; and exposing the oxide superconductor wire to an environment which substantially converts the porous isolating layer into a solderable metal.

2. A method of processing an oxide superconductor wire, comprising the steps of:

providing an oxide superconductor wire, applying an isolating layer to an external surface of the oxide superconductor wire to form a coated wire, the isolating layer comprising an isolating material and a porosity-inducing component;

heating the coated wire so as to induce porosity into the isolating layer, thereby obtaining a removable porous isolating layer;

further processing the coated wire;

removing at least a majority of the porous isolating layer; and exposing the oxide superconductor wire to an environment which converts any remaining portions of the porous isolating layer into a solderable metal.

3. The method of claim 2, wherein the isolating material comprises copper oxide.

4. The method of claim 2, wherein the isolating material comprises silver sulfide.

5. The method of claim 2, wherein the porosity-inducing component comprises a material selected from the group consisting of cellulose, wood fiber, saw dust, graphite, paraffin, polypropylene, polyethylene, and mixtures thereof.

6. The method of claim 2, wherein the porosity-inducing component is an extrudable binder.

7. The method of claim 2, wherein the isolating layer is applied by spray coating, dip coating, or coating with an adhesive slurry.

8. The method of claim 2, wherein the isolating layer is applied by sequential coating of the wire with the porosity-inducing component and the isolating material.

9. The method of claim 8, wherein coating with the isolating material comprises electroplating.

10. The method of claim 2, wherein the isolating material is in a metallic form during application of the layer, and is subsequently converted to a compound.

11. The method of claim 2, wherein the isolating layer is applied by coextrusion.

12. The method of claim 2, wherein the isolating layer is applied electrostatically.

13. The method of claim 2, wherein further processing comprises heat treating the wire to produce a desired oxide superconductor.

14. The method of claim 2, wherein removing at least a majority of the porous isolating layer comprises removing the layer using a method selected from the group consisting of passing the wire under a stream of water, chemically or electrolytically etching the wire, abrading the wire surface, passing the wire through an ultrasonic bath, wiping the wire, and applying a vacuum or blower to the wire.

15. The method of claim 2, wherein removing at least a majority of the porous isolating layer comprises removing at least 75% of the layer.

16. The method of claim 2, wherein removing at least a majority of the porous isolating layer comprises removing at least 80% of the layer.

17. The method of claim 2, wherein removing at least a majority of the porous isolating layer comprises removing at least 85% of the layer.

18. The method of claim 2, wherein removing at least a majority of the porous isolating layer comprises removing at least 90% of the layer.

19. The method of claim 2, wherein removing at least a majority of the porous isolating layer comprises removing at least 95% of the layer.

20. The method of claim 2, wherein the environment to which the wire is exposed comprises hydrogen gas, forming gas, hydrogen chloride gas, hydrochloric acid, carboxylic acid, ammonium chloride, or a borax.

21. The method of claim 2, wherein the environment to which the wire is exposed comprises solder flux.

* * * * *